(12) United States Patent
Wang

(10) Patent No.: US 10,872,971 B1
(45) Date of Patent: Dec. 22, 2020

(54) SEMICONDUCTOR STRUCTURE AND FORMATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 0 days.

(21) Appl. No.: 16/556,790

(22) Filed: Aug. 30, 2019

(30) Foreign Application Priority Data

Jun. 18, 2019 (CN) .......................... 2019 1 0527547

(51) Int. Cl.
*H01L 29/66* (2006.01)
*H01L 29/78* (2006.01)
(Continued)

(52) U.S. Cl.
CPC .... *H01L 29/6681* (2013.01); *H01L 21/02321* (2013.01); *H01L 21/02351* (2013.01);
(Continued)

(58) Field of Classification Search
CPC .......... H01L 29/6681; H01L 21/02351; H01L 21/31116; H01L 29/0649; H01L 29/42376;
(Continued)

(56) References Cited

U.S. PATENT DOCUMENTS 9,184,169 B2 * 11/2015 Kim .................... H01L 29/6656
9,601,383 B1 * 3/2017 Akarvardar ......... H01L 29/0649
(Continued)

*Primary Examiner* — Victor A Mandala
(74) *Attorney, Agent, or Firm* — Brinks Gilson & Lione

(57) ABSTRACT

A semiconductor structure and a formation method thereof are provided. In one form, the method includes: providing a base; patterning the base to form a substrate and discrete fins and pseudo fins which protrude from the substrate, wherein the fins are located in a device region, and the pseudo fins are located in isolation regions; removing the pseudo fins in the isolation regions; forming isolation layers on the substrate exposed by the fins, wherein the isolation layers cover part of the side walls of the fins; and thinning the isolation layers in the isolation regions, wherein the remaining isolation layers in the isolation regions are regarded as target isolation layers, and the surfaces of the target isolation layers are lower than the surfaces of the isolation layers between the discrete fins. Since the surfaces of the target isolation layers are lower than the surfaces of the isolation layers between the discrete fins, the volume of the target isolation layers is correspondingly reduced, and then stress generated by the target isolation layers on the fins is lowered, which causes the stress on both sides of the fins to be balanced, avoids the problem of bending or tilting of the fins in the device region in case of stress imbalance and improves the electrical performance of the semiconductor structure.

11 Claims, 7 Drawing Sheets

(51) Int. Cl.
*H01L 21/762* (2006.01)
*H01L 21/311* (2006.01)
*H01L 21/3115* (2006.01)
*H01L 21/02* (2006.01)
*H01L 21/28* (2006.01)
*H01L 29/423* (2006.01)
*H01L 29/06* (2006.01)

(52) U.S. Cl.
CPC ... *H01L 21/28114* (2013.01); *H01L 21/31111* (2013.01); *H01L 21/31116* (2013.01); *H01L 21/31144* (2013.01); *H01L 21/31155* (2013.01); *H01L 21/76224* (2013.01); *H01L 29/0649* (2013.01); *H01L 29/42376* (2013.01); *H01L 29/7851* (2013.01); *H01L 29/7856* (2013.01)

(58) Field of Classification Search
CPC .......... H01L 21/02321; H01L 29/7856; H01L 21/28114; H01L 21/31144; H01L 21/76224; H01L 21/31111; H01L 29/7851; H01L 21/31155
See application file for complete search history.

(56) References Cited

U.S. PATENT DOCUMENTS

| | | | |
|---|---|---|---|
| 9,768,072 B1* | 9/2017 | Cheng | H01L 21/823487 |
| 2017/0040162 A1* | 2/2017 | Smith | H01L 29/66795 |
| 2018/0108754 A1* | 4/2018 | Anderson | H01L 29/6681 |
| 2018/0323192 A1* | 11/2018 | Li | H01L 21/823431 |
| 2019/0074353 A1* | 3/2019 | Zhao | H01L 21/3085 |
| 2019/0148235 A1* | 5/2019 | Wang | H01L 29/6681 257/401 |
| 2019/0148241 A1* | 5/2019 | Chao | H01L 29/66545 438/283 |
| 2019/0157158 A1* | 5/2019 | Leobandung | H01L 23/485 |
| 2019/0326163 A1* | 10/2019 | Xu | H01L 27/0886 |
| 2020/0235204 A1* | 7/2020 | Cheng | H01L 21/823807 |

* cited by examiner

SEMICONDUCTOR STRUCTURE AND FORMATION METHOD THEREOF

RELATED APPLICATIONS

The present application claims priority to Chinese Patent Appln. No. 201910527547.X, filed Jun. 18, 2019, the entire disclosure of which is hereby incorporated by reference.

BACKGROUND

Technical Field

Embodiments and implementations of the present disclosure relate to the field of semiconductor manufacturing, and in particular to a semiconductor structure and a formation method thereof.

Related Art

In semiconductor manufacturing, with the development of very large scale integrated circuits, a feature size of an integrated circuit continues to decrease. In order to adapt to a smaller feature size, a channel length of a Metal-Oxide-Semiconductor Field-Effect Transistor (MOSFET) is also reduced. However, as the channel length of a device is reduced, a distance between a source and a drain of the device is also shortened, so that the capacity of a gate structure for controlling a channel is reduced, and the difficulty for a gate voltage to pinch off a channel becomes greater, which causes a subthreshold leakage phenomenon, namely the so-called Short-Channel Effects (SCE), to occur more easily.

Therefore, in order to better adapt to the reduction in feature size, semiconductor processes begin to transit from planar MOSFET to more efficient three-dimensional transistors, such as fin Field Effect Transistors (FinFET). In the FinFET, the gate structure at least can control an ultra-thin body (a fin) from two sides. Compared with the planar MOSFET, the FinFET has the advantages that the gate structure has higher capacity for controlling the channel, and the SCE can be well suppressed. Furthermore, the FinFET is higher in compatibility with existing integrated circuit manufacturing than other devices.

However, the electrical performance of a semiconductor device formed by the prior art still needs to be improved.

SUMMARY

To address the problems, the present disclosure provides a semiconductor structure and a formation method thereof, so as to improve the electrical performance of a device.

The present disclosure provides a formation method of a semiconductor structure. In one form, a method includes: providing a base, wherein the base includes a device region used for forming a device and isolation regions located at both sides of the device region; patterning the base to form a substrate and discrete fins and pseudo fins which protrude from the substrate, wherein the fins are located in the device region, and where the pseudo fins are located in the isolation regions; removing the pseudo fins in the isolation regions; forming isolation layers on the substrate exposed by the fins, wherein the isolation layers cover part of the side walls of the fins; and thinning the isolation layers in the isolation regions, wherein the remaining isolation layers in the isolation regions are regarded as target isolation layers, and the surfaces of the target isolation layers are lower than the surfaces of the isolation layers between the discrete fins.

In some implementations, the method further includes: while thinning the isolation layers of the isolation regions, thinning the isolation layers between edge fins and the isolation regions, where the edge fins are fins close to an edge of the device region.

In some implementations, the step of thinning the isolation layers in the isolation regions includes: forming first mask layers, wherein the first mask layers cover only the isolation layers between the discrete fins; and etching and thinning the isolation layers by taking the first mask layers as masks.

In some implementations, the step of forming the first mask layers includes: forming first mask material layers, wherein the first mask material layers conformally cover the isolation layers and the fins, and completely fill gaps among the discrete fins; doping ions on the surfaces of the first mask material layers such that the etching rate of the doped first mask material layers is greater than that of the undoped first mask material layers; and etching the first mask material layers to maintain the first mask material layers remaining between the discrete fins as the first mask layers.

In some implementations, an ion implantation process is adopted to dope the ions on the surfaces of the first mask material layers.

In some implementations, process parameters for ion implantation include: the implantation energy is less than or equal to 5 Kev; argon ions serve as implanted ions; the implantation dose is greater than or equal to 4.0E14 atoms per square centimeter; and an implantation direction forms an included angle of 30 to 60 degrees with the side walls of the fins.

In some implementations, a wet etching process is adopted to etch and thin the isolation layers.

In some implementations, a height difference between the surfaces of the target isolation layers and the surfaces of the isolation layers between the discrete fins is 5 nm to 30 nm.

In some implementations, a height difference between the surface of the substrate of the isolation regions and the surface of the substrate of the device region is 2 nm to 10 nm.

In some implementations, the method further includes: after the step of thinning the isolation layers in the isolation regions, forming a gate structure spanning the fins and covering part of the top surfaces and part of the side walls of the fins.

In some implementations, the method further includes: after the step of thinning the isolation layers in the isolation regions, annealing the base with the thinned isolation layers in the isolation regions.

The present disclosure further provides a semiconductor structure. In one form, the semiconductor structure includes: a substrate, including a device region for forming a device and isolation regions located at both sides of the device region; discrete fins, protruding from the substrate of the device region; isolation layers, located on the substrate exposed by the fins, wherein the isolation layers cover part of side walls of the fins; and wherein the isolation layers located in the isolation regions are regarded as target isolation layers, and the surfaces of the target isolation layers are lower than the surfaces of the isolation layers between the discrete fins.

In some implementations, the isolation layers between the isolation regions and edge fins are flush with the target isolation layers, and the edge fins are fins close to the edge of the device region.

In some implementations, a height difference between the surfaces of the target isolation layers and the surfaces of the isolation layers between the discrete fins is 5 nm to 30 nm.

In some implementations, a height difference between the surface of the substrate of the isolation regions and the surface of the substrate of the device region is 2 nm to 10 nm.

In some implementations, the semiconductor structure further includes a gate structure, spanning the fins and covering part of the top surfaces and part of the side walls of the fins.

Compared with the prior art, technical solutions of embodiments and implementations of the present disclosure have the following advantages.

According to embodiments and implementations of the present disclosure, after the isolation layers are formed on the substrate exposed by the fins, the isolation layers in the isolation regions are thinned; the remaining isolation layers in the isolation regions are regarded as the target isolation layers, and the surfaces of the target isolation layers are lower than the surfaces of the isolation layers between the discrete fins. Since the surfaces of the target isolation layers are lower than the surfaces of the isolation layers between the discrete fins, the stress generated by the target isolation layers on the fins is lowered, which causes the stress on both sides of the fins to be balanced, avoids the problem of bending or tilting of the fins in the device region in case of stress imbalance and improves the electrical performance of the semiconductor structure.

In alternative solutions of the present disclosure, the isolation layers between the edge fins and the isolation regions are thinned while thinning the isolation layers in the isolation regions, and the edge fins are the fins close to the edge of the device region, thereby enlarging the exposure area of the side walls of the sides, facing the isolation regions, of the edge fins, so that the contact area between the gate structure and the side walls of the edge fins can be enlarged during the subsequent formation of the gate structure spanning part of the side walls of the fins; and therefore, the gate control capacity of the semiconductor structure is improved, and the electrical performance of the semiconductor structure is further improved.

DETAILED DESCRIPTION

A device currently formed still has the problem of low performance. The cause of low device performance is now analyzed in combination with a formation method of a semiconductor structure.

Referring to FIGS. 1 to 5, structural schematic diagrams corresponding to steps in one form of a method for forming a semiconductor structure are shown.

Figure 1:
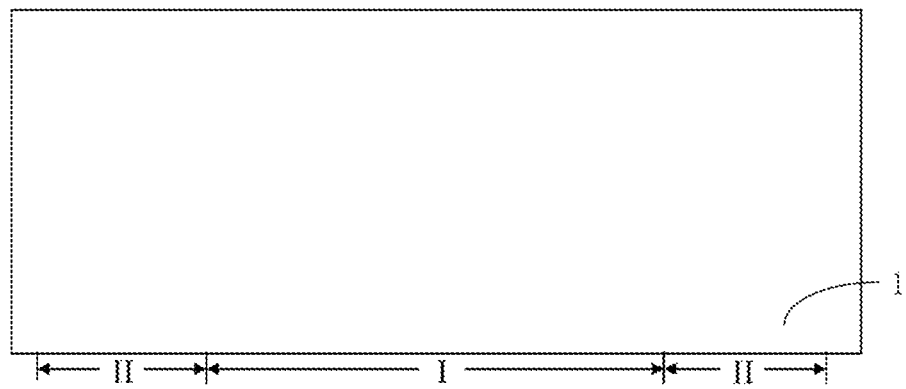
FIGS. 1 to 5 are structural schematic diagrams corresponding to steps in one form of a method for forming a semiconductor structure.

Referring to FIG. 1, a base 1 is provided. The base 1 includes a device region I for forming a device and isolation regions II located at both sides of the device region I.

Figure 2:
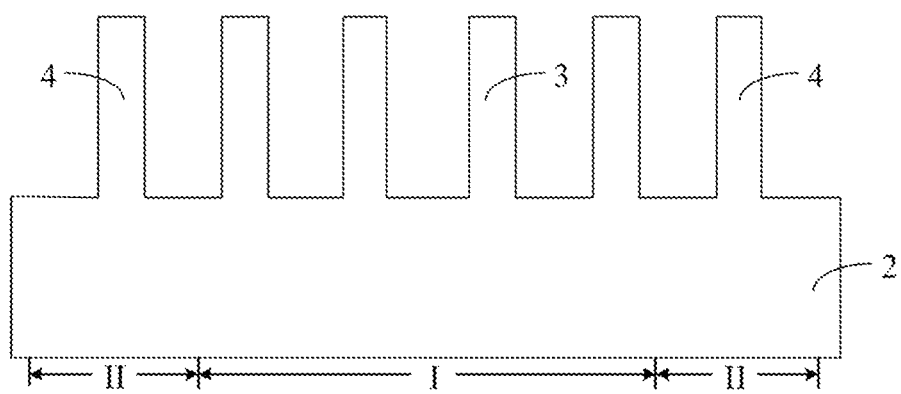

Referring to FIG. 2, the base 1 is patterned to form a substrate 2 and discrete fins 3 and pseudo fins 4 which protrude from the substrate. The fins 3 are located in the device region I, and the pseudo fins 4 are located in the isolation regions II.

Figure 3:
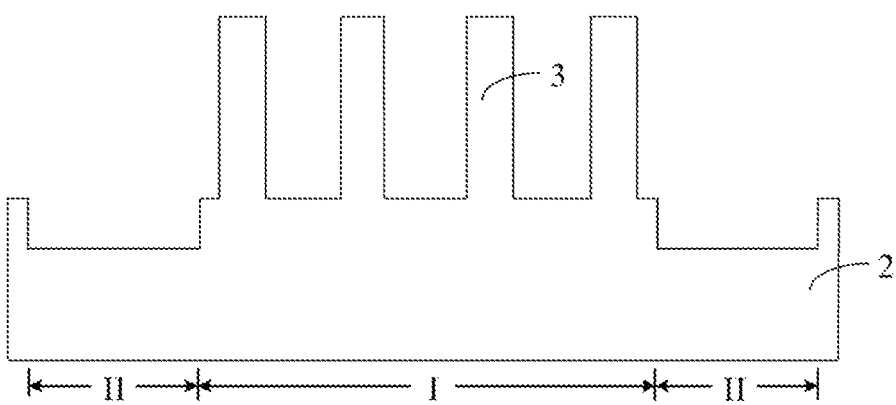

Referring to FIG. 3, after the base 1 (as shown in FIG. 1) is patterned, the pseudo fins 4 are removed by etching (as shown in FIG. 2).

Figure 4:
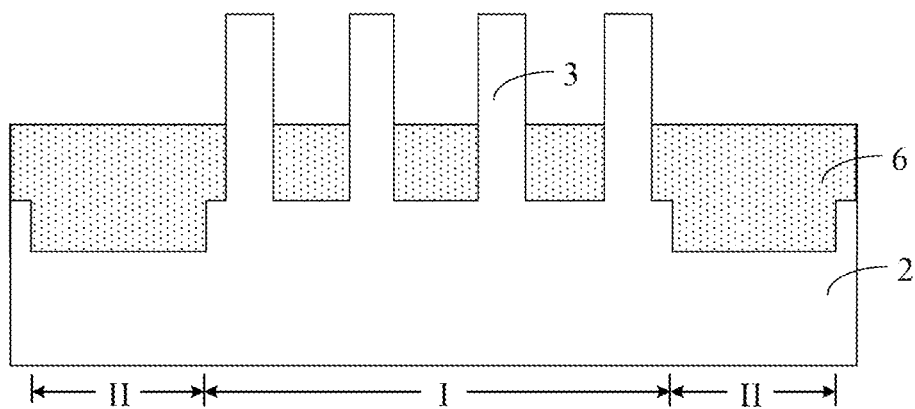
Figure 5:
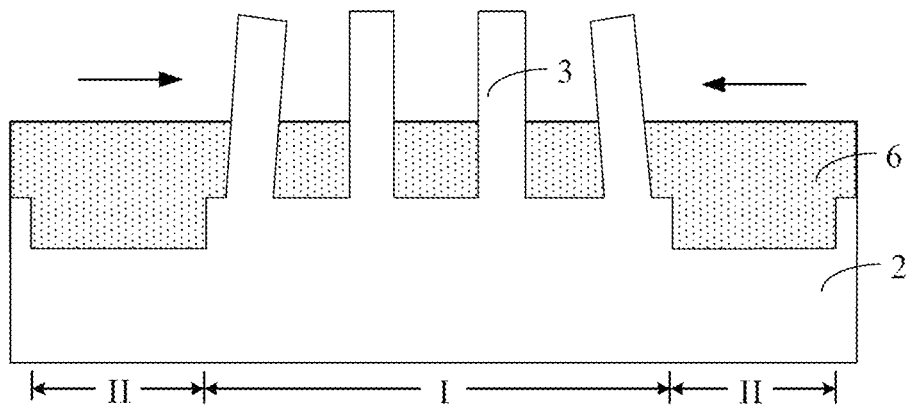

Referring to FIGS. 4 and 5 together, isolation layers 6 are formed on the substrate 2 exposed by the fins 3. The isolation layers 6 cover part of the side walls of the fins 3.

In implementations of the formation method, in the step that the pseudo fins in the isolation regions are removed, since the pseudo fins and the substrate are made of a same material, certain thickness of the substrate may be inevitably removed during the removal (as shown in FIGS. 3 to 5), which makes the surfaces of the substrate in the isolation regions II be lower than the surface of the substrate of the device region I, and then causes the isolation layers formed in the isolation regions II to be relatively thick after the isolation layers are formed.

During the annealing of the device, the isolation layers would generate stress due to expansion. Since the isolation layers in the isolation regions are relatively thick, a relatively large volume is needed, and correspondingly also generate relatively high stress, and then there is a relatively large stress difference caused between the isolation layers in the isolation regions and the isolation layers between the fins in the device region, which easily causes the fins in the device region to bend or tilt (as shown in FIG. 5), thereby easily increasing the probability of a variability problem in the semiconductor structure and leading to low electrical performance of the formed semiconductor structure.

To address the technical problems, the present disclosure provides a formation method of a semiconductor structure. In one form, a method includes: a base is provided, wherein the base includes a device region used for forming a device and isolation regions located at both sides of the device region; the base is patterned to form a substrate and discrete fins and pseudo fins which protrude from the substrate, wherein the fins are located in the device region, and the pseudo fins are located in the isolation regions; the pseudo fins in the isolation regions are removed; isolation layers are formed on the substrate exposed by the fins, wherein the isolation layers cover part of the side walls of the fins; and the isolation layers in the isolation regions are thinned, wherein the remaining isolation layers in the isolation regions are regarded as target isolation layers, and the surfaces of the target isolation layers are lower than the surfaces of the isolation layers between the discrete fins.

It can be seen that, in some implementations of the present disclosure, after the isolation layers are formed on the substrate exposed by the fins, the isolation layers in the isolation regions are thinned; the remaining isolation layers in the isolation regions are regarded as the target isolation layers, and the surfaces of the target isolation layers are lower than the surfaces of the isolation layers between the discrete fins. Since the surfaces of the target isolation layers are lower than the surfaces of the isolation layers between the discrete fins, the volume of the target isolation layers is correspondingly reduced, and the stress generated by the target isolation layers on the fins is lowered, which causes the stress on both sides of the fins to be balanced, avoids the problem of bending or tilting of the fins in the device region in case of stress imbalance and improves the electrical performance of the semiconductor structure.

In order to make the above objectives, features and advantages of the present disclosure clearer and understandable, specific embodiments and implementations of the present disclosure are described in detail below in combination with accompanying drawings.

FIGS. 6 to 15 are structural schematic diagrams corresponding to steps in a form of a method for forming a semiconductor structure according to the present disclosure.

Figure 6:
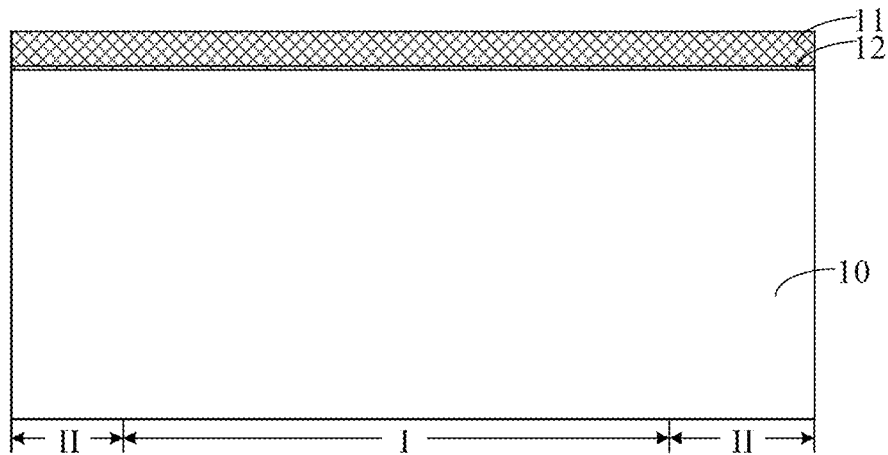
FIGS. 6 to 15 are structural schematic diagrams corresponding to steps in another form of a method for forming a semiconductor structure.

Referring to FIG. 6, a base 10 is provided. The base 10 includes a device region I for forming a device and isolation regions II located at both sides of the device region.

The base 10 is configured to subsequently form a substrate and fins protruding from the substrate. The base 10 is also configured to provide a process platform for subsequent formation of a semiconductor structure.

In some implementations, the base 10 is of an integrated structure, thereby facilitating simplification of the technological process. In other implementations, the base may also include a first semiconductor material layer and a second semiconductor material layer located on the first semiconductor material layer, thereby fulfilling the aim of accurately controlling a subsequent fin formation height.

In some implementations, the material of the base 10 is silicon. In other implementations, the material of the base may also be other materials such as germanium, silicon germanium, silicon carbide, gallium arsenide or gallium indium, and the base may also be other types of bases such as a silicon base or a gallium base on an insulator. The material of the base may be a material suitable for process requirements or easy to integrate.

In some implementations, a fin mask material layer 11 is further formed at the top of the base 10. The fin mask material layer 11 is configured to form a fin mask layer for patterning the base 10 through a subsequent process. In some implementations, the material of the fin mask material layer 11 is silicon nitride.

The silicon nitride material generates relatively high stress when being heated. Therefore, in some implementations, a stress buffer material layer 12 is further formed between the fin mask material layer 11 and the base 10. The stress buffer material layer 12 achieves a stress buffer effect, which is advantageous for improvement of the adhesion between the fin mask material layer 11 and the base 10, so that the adhesion between the subsequent fin mask layer and the fins is correspondingly improved. In some implementations, the material of the stress buffer material layer 12 is silicon oxide.

Figure 7:
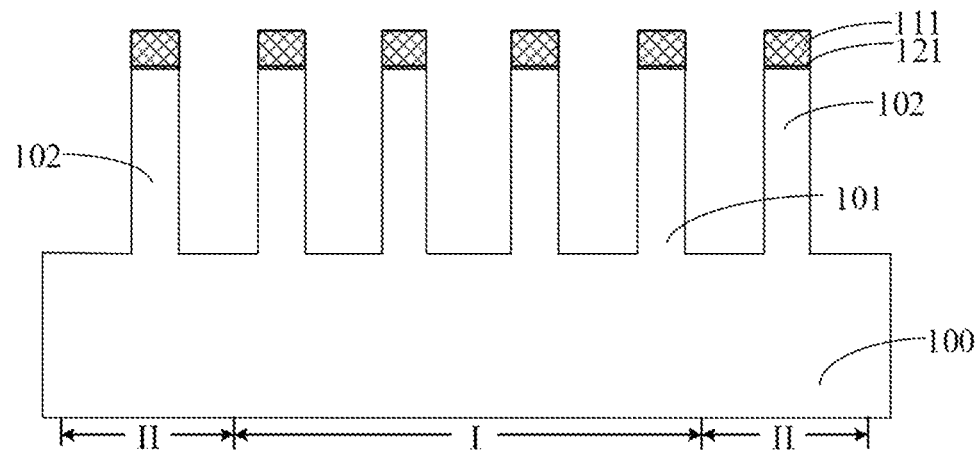

Referring to FIG. 7, the base 10 (as shown in FIG. 6) is patterned to form a substrate 100 and fins 101 and pseudo fins 102 which protrude from the substrate 100. The fins 101 are located in the device region, and the pseudo fins 102 are located in the isolation regions.

The substrate 100 is configured to provide a process platform for the subsequent formation of the semiconductor structure.

In some implementations, the substrate 100 is a silicon substrate. In other implementations, the material of the substrate may also be other materials such as germanium, silicon germanium, silicon carbide, gallium arsenide or gallium indium, and the substrate may also be other types of substrates such as a silicon base or a gallium base on an insulator.

The fins 101 are configured to subsequently provide a channel of a fin field effect transistor. The fins 101 and the substrate 100 are obtained by etching a same semiconductor material layer. The material of the fins 101 is the same as the material of the substrate 100. In some implementations, the material of the fins 101 is silicon.

The pseudo fins 102 are configured to improve the dimensional uniformity and shape uniformity of the fins 101. The pseudo fins 102 may be removed in the subsequent step. The pseudo fins 102, the fins 101 and the substrate 100 are obtained by etching the same semiconductor material layer. The material of the pseudo fins 102 is the same as the material of the fins 101 and the substrate 100. In some implementations, the material of the pseudo fins 102 is silicon.

That is, in this step, the substrate 100 and the discrete fins 101 and pseudo fins 102 protruding from the substrate 100 are simultaneously formed by etching a semiconductor material. The fins 101 are located in the device region, and the pseudo fins 102 are located in the isolation regions.

In some implementations, the base 10 is patterned by Self-Aligned Double Patterning (SADP) or Self-Aligned Quadruple Patterning (SAQP), thereby advantageously improving the patterning density and precision of the fins 101 to achieve smaller periodic pattern imaging.

In some implementations, the stress buffer material layer 12 (as shown in FIG. 6) and the fin mask material layer 11 (as shown in FIG. 6) are further formed at the top of the base 10. Therefore, before the base 10 is patterned, the method further includes that: the fin mask material layer 11 and the stress buffer material layer 12 are patterned to form fin mask layers 111 and stress buffer layers 121.

The fin mask layers 111 are used as etching masks for forming the fins 101, the pseudo fins 102 and the substrate 100. The fin mask layers 111 may also protect the tops of the fins 101 and the pseudo fins 102 in the subsequent process. As shown in FIG. 7, the stress buffer layers 121 are respectively located between the fin mask layers 111 and the fins 101 as well as between the fin mask layers 111 and the pseudo fins 102, so that the stress buffer effect can be achieved, and the adhesion between the fin mask layers 111 and the fins 101 as well as between the fin mask layers 111 and the pseudo fins 102 is improved.

Correspondingly, in the step that the base 10 is patterned, the base 10 is patterned by taking the fin mask layers 111 as masks to form the substrate 100 and the fins 101 and the pseudo fins 102 which protrude from the substrate 100.

It should be noted that since the substrate of the device region I and the substrate of the isolation regions II are formed under the same etching conditions, the surfaces, located in the device region I and the isolation region II, of the substrate formed in this step are flush with each other.

Figure 8:
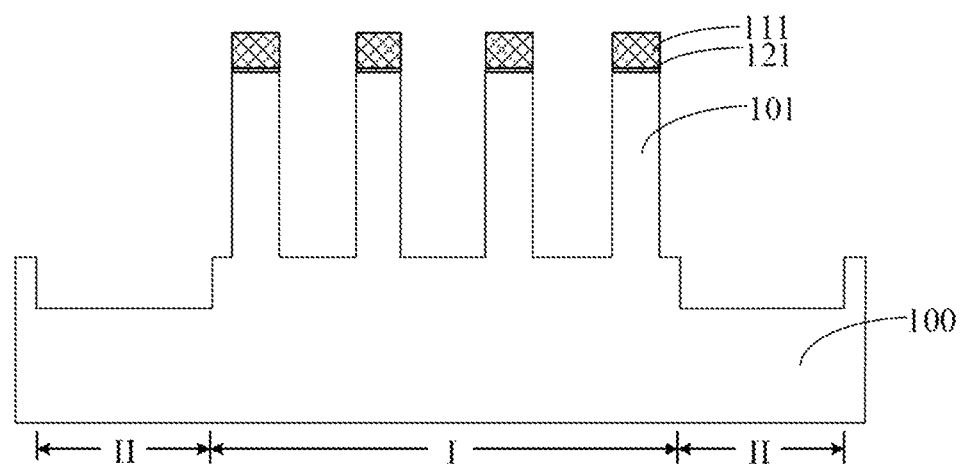

Referring to FIG. 8, the pseudo fins 102 in the isolation regions II are removed.

By removing the pseudo fins 102, the influence of the pseudo fins 102 on the subsequent process is avoided, and then problems such as leakage current and stray capacitance possibly caused by the pseudo fins 102 during the device formation are avoided.

The pseudo fins 102 may be removed by a fin cut last process commonly used in the semiconductor field, which advantageously reducing the process operation difficulty and improving the process compatibility.

Specifically, the removal of the pseudo fins 102 in the isolation regions II may include that: a device region mask layer (not shown in the figures) covering the device region I is formed, and the pseudo fins 102 in the isolation regions II are etched to be removed by taking the device region mask layer as a mask.

It should be noted that in some implementations, the material of the pseudo fins 102 and the material of the substrate 100 are the same semiconductor material. Therefore, in this step that the pseudo fins 102 in the isolation regions II are etched to be removed, it is inevitable to remove certain thickness of the substrate 100 (as shown in FIG. 8) regardless of the adopted process (including wet etching, dry etching, etc.). That is, while the pseudo fins 102 in the isolation regions II are removed, certain thickness of the substrate 100 in the isolation regions II is also removed.

The reduced thickness of the substrate of the isolation regions varies according to a specific process type. In the normal case, the reduced thickness of the substrate of the isolation regions is 2 nm to 10 nm. That is, in some implementations, the surface of the substrate of the isolation regions and the surface of the substrate of the device region have a height difference of 2 nm to 10 nm.

Since the surface of the substrate of the isolation regions and the surface of the substrate of the device region have the height difference, the isolation layers subsequently formed on the basis of the substrate in this step have different thicknesses respectively in the device region and the isolation regions, and a relatively large difference in volume of the two parts is caused, which in turn causes a stress imbalance in the device region and the isolation regions and affects the electrical performance of the semiconductor structure.

Figure 9:
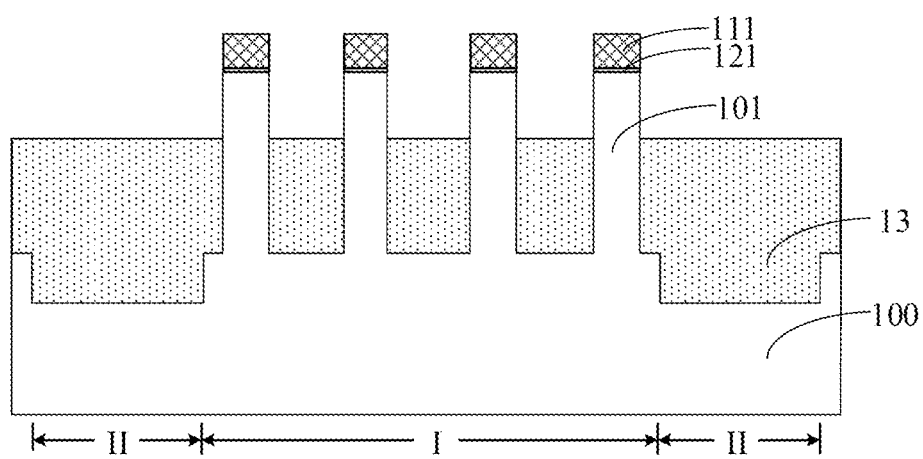
Figure 10:
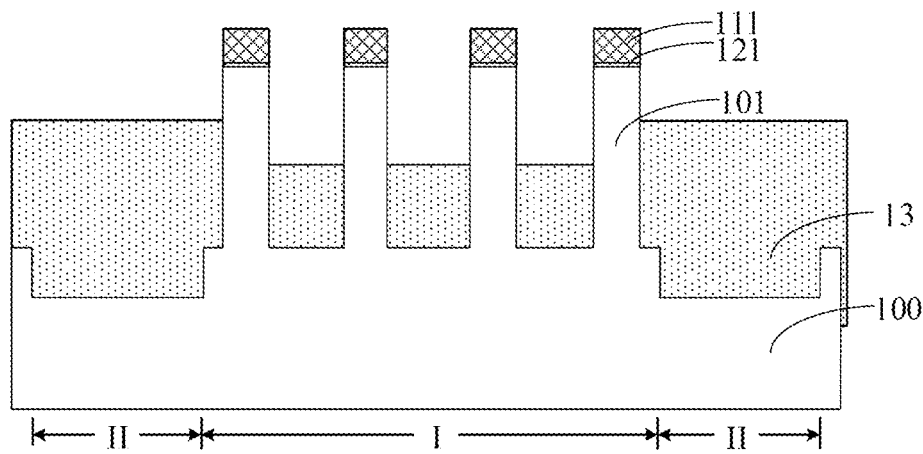

Referring to FIGS. 9 to 10, isolation layers 13 are formed on the substrate exposed by the fins 101. The isolation layers 13 cover part of the side walls of the fins 101.

The isolation layers 13 are configured to play an isolation role between adjacent devices.

In some implementations, the material of the isolation layers 13 is silicon oxide. Silicon oxide is a commonly used low-cost dielectric material, and has relatively high process compatibility, which is advantageous for reducing the process difficulty and process cost of forming the isolation layers 13. In addition, the dielectric constant of the silicon oxide is relatively small, which is also advantageous for enhancing the effect of the isolation layers 13 for isolating adjacent devices. In other implementations, the material of the isolation layers may also be other insulation materials such as silicon nitride and silicon oxynitride.

Specifically, the step that the isolation layers 13 are formed includes that: isolation films (not shown in the figure) that completely cover the substrate 100 and the fins 101 are formed; the isolation films are ground to be removed by taking the fin mask layers as stop layers; and certain thickness of the isolation films are etched to be removed till part of the side walls of the fins 101 are exposed, and the remaining isolation films are regarded as the isolation layers 13.

In some implementations, isolation films formed by a Flowable Chemical Vapor Deposition (FCVD) process are adopted. The FCVD process has good filling capacity and is suitable for filling openings with high depth-to-width ratio, which is advantageous for reduction of the probability of formation of defects such as voids in the isolation films and is correspondingly advantageous for improvement of the film formation quality of the isolation layers 13.

In the step that certain thickness of the isolation films on the side walls of the fins are etched to be removed, the removal may be performed by a wet or dry etching process. Since the ground isolation films are flush in the device region and the isolation regions, the isolation layers 13 formed by etching to remove certain thickness of the isolation films are also basically flush in the device region and the isolation regions.

It should be noted that the surface of the substrate of the isolation regions and the surface of the substrate of the device region have the height difference, and the surfaces of the isolation layers, formed on the substrate exposed by the fins, in the device region are flush with the surfaces in the isolation regions, so that the isolation layers formed in this step have different thickness respectively in the device region and the isolation regions, which in turn causes a stress imbalance in the device region and the isolation regions and affects the electrical performance of the semiconductor structure.

Moreover, referring to FIG. 10, in the step that certain thickness of the isolation films are etched to be removed, the etching rate of the isolation films between the fins 101 is greater than that of the isolation films at other positions due to the etching edge effect, so that the surfaces of the isolation layers formed between the fins 101 are lower than the surfaces of the isolation layers in the isolation regions, which further increases the thickness difference between the isolation layers in the isolation regions and the isolation layers between the fins 101, thereby aggravating the stress imbalance in the device region I and the isolation regions II and affecting the electrical performance of the semiconductor structure.

To address this problem, in the subsequent steps of some implementations of the present disclosure, by thinning the isolation layers in the isolation regions, the thickness difference between the isolation layers in the isolation regions and the isolation layers between the fins is reduced, the stress imbalance caused by the isolation layers in the device region and the isolation regions is avoided, and the electrical performance of the semiconductor structure is improved.

Figure 11:
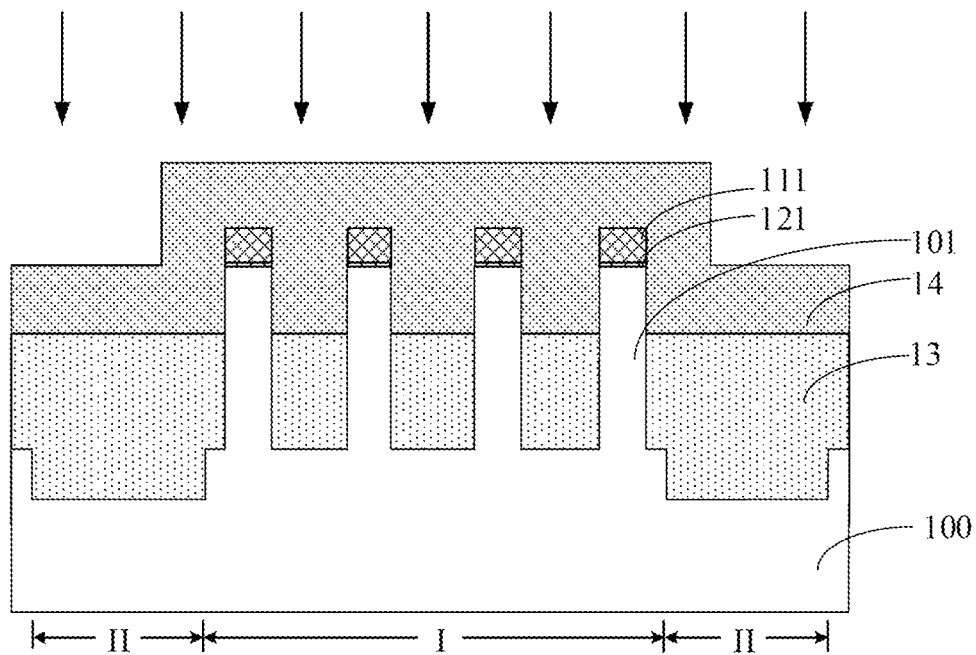
Figure 12:
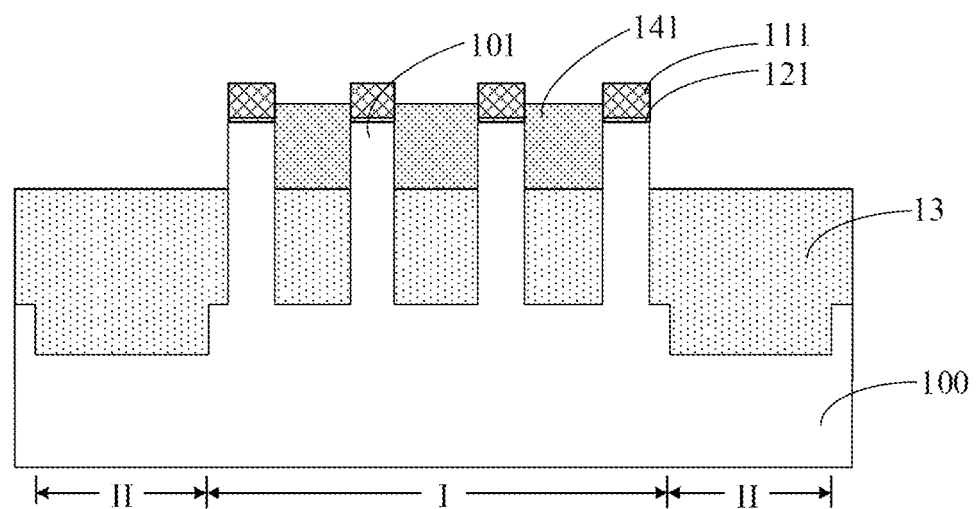
Figure 13:
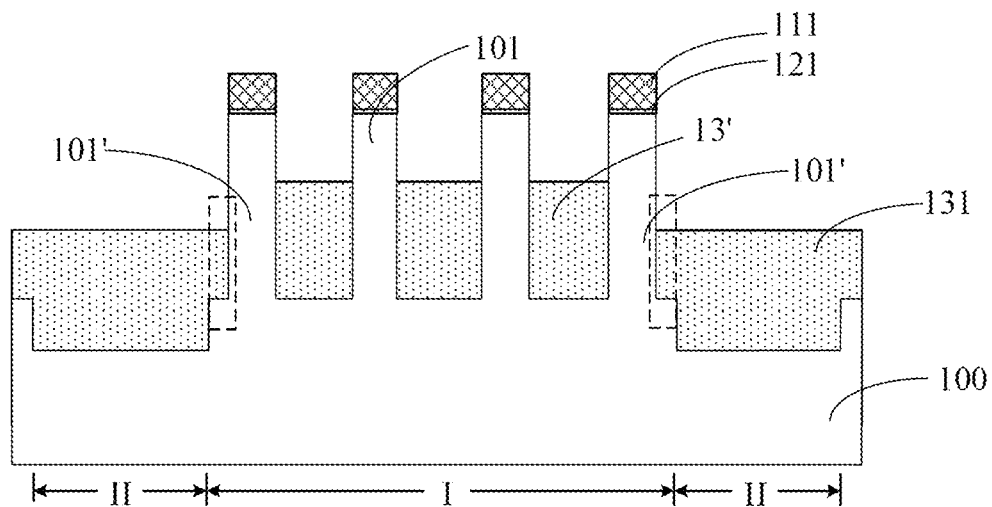

Referring to FIGS. 11 to 13, the isolation layers 13 in the isolation regions II are thinned. The remaining isolation layers in the isolation regions II are regarded as target isolation layers 131 (as shown in FIG. 13), and the surfaces of the target isolation layers 131 are lower than the surfaces of the isolation layers 13' between the discrete fins 101.

Referring to FIG. 13, by thinning the isolation layers 13 in the isolation regions II to form the target isolation layers 131 with the surfaces lower than the surfaces of the isolation layers 13' between the discrete fins 101, stress generated by the target isolation layers 131 on the fins 101 (particularly the edge fins 101' close to the device region I) may be lowered, which causes the stress on both sides of the fins 101 to be balanced, avoids the problem of bending or tilting of the fins 101 in case of stress imbalance and improves the electrical performance of the semiconductor structure.

In some implementations, the height difference between the surfaces of the target isolation layers and the surfaces of the isolation layers between the discrete fins should neither be too large nor be too small. If the height difference is too large, the stress on one side of the isolation region may be extremely low, and causes the fins to bend or tilt toward the one side of the isolation region under the stress action of the isolation layers between the fins. If the height difference is too small, it may not play a role in adjusting the stress on both sides of the fins to be balanced. In some implementations, the height difference is greater than or equal to the height difference between the surface of the substrate of the isolation regions and the surface of the substrate of the device region. Optionally, the height difference is 5 nm to 30 nm. Specifically, the height difference may be 10 nm or 20 nm.

In some implementations, while the isolation layers 13 in the isolation regions II are thinned, the isolation layers between the edge fins 101' and the isolation regions II are also thinned (referring to dotted frame areas in FIG. 13). The edge fins 101' are fins close to the edge of the device region, thereby enlarging the exposure area of the side walls of the sides, facing the isolation regions II, of the edge fins 101'. During the subsequent formation of a gate structure spanning part of the side walls of the fins, the contact area between the gate structure and the side walls of the edge fins may be enlarged, so that the gate control capacity of the semiconductor structure is improved, and the electrical performance of the semiconductor structure is further improved.

Specifically, the step that the isolation layers 13 in the isolation regions II are thinned includes that: referring to FIGS. 11 to 12, first mask layers 141 are formed. The first mask layers cover only the isolation layers between the discrete fins.

The first mask layers 141 are configured to provide masks for the subsequent thinning of the isolation layers 13 so as to protect the isolation layers between the discrete fins 101.

Referring to FIGS. 11 to 12, the step that the first mask layers 141 are formed may include that: first mask material layers 14 are formed (as shown in FIG. 11), wherein the first mask material layers 14 conformally cover the isolation layers 13 and the fins 101, and completely fill gaps among the discrete fins 101; ions are doped on the surfaces of the first mask material layers 14 such that the etching rate of the doped first mask material layers is greater than that of the undoped first mask material layers; the first mask material layers 14 is etched, and the remaining first mask material layers between the discrete fins 101 are maintained as the first mask layers 141 (as shown in FIG. 12).

It should be noted that the first mask material layer 14 is a hard mask material layer, and the material of the hard mask material layer may be one or more of silicon oxide, silicon nitride, silicon carbide, silicon carbonitride, silicon oxycarbonitride and silicon oxynitride. In some implementations, the material of the first mask material layer is silicon nitride, which may be formed by a Chemical Vapor Deposition (CVD) process.

Referring to FIG. 11, since the first mask material layers 14 conformally cover the isolation layers 13 and the fins 101, and completely fill the gaps among the discrete fins 101, the thickness of the first mask material layers 14 formed between the discrete fins 101 is much greater than the thickness of the first mask material layers 14 in the isolation regions. Process parameters for doping treatment are adjusted to maintain the thickness of the doped first mask material layers 14 in a range slightly greater than or equal to the thickness of the first mask material layer 14 in the isolation regions II, so as to prevent the first mask material layers 14 between the discrete fins 101 from being doped, and then only the first mask material layers 14 between the discrete fins 101 are left in the subsequent etching treatment.

Specifically, in some implementations, the ions are doped on the surfaces of the first mask material layers 14 by an ion implantation method. The first mask material layer 14 is silicon nitride, and the doping ions are argon ions. After the argon ions are implanted, the etching rate of the doped silicon nitride is greater than that of the undoped silicon nitride, so when the first mask material layers 14 are etched, the etching rate of the first mask material layers located on the surface is greater than that of the first mask material layers located between the fins 101.

It should be noted that the doping ion implantation dose should neither be too large nor be too small. If the doping ion implantation dose is too large, much process time may be spent, and the production efficiency is low. If the doping ion implantation dose is too small, it is disadvantageous for the increase of the etching selection ratio of the ion-doped first mask material layers 14 to the ion-undoped first mask material layers 14 and the subsequent removal of the ion-doped first mask material layers 14. In some implementations, the implantation dose is 4.0E14 atoms per square centimeter to 5.0E15 atoms per square centimeter. In other implementations of the present disclosure, the implantation dose may also be set according to actual conditions, and shall be more than or equal to 4.0E14 atoms per square centimeter.

It should be noted that the doping ion implantation energy should not be too high. If the doping ion implantation energy is too high, the doping ions may easily pass through the first mask material layers 14 and enter the substrate 100, thus causing contamination and affecting the electrical performance of the device. In some implementations, the implantation energy is less than or equal to 5 Kev. In some implementations, the implantation energy may be 4 Kev.

It should be noted that an included angle between the ion implantation direction and the side walls of the fins 101 should neither be too large nor be too small. If the included angle between the ion implantation direction and the side walls of the fins 101 is too large, it is difficult to implant ions into the bottoms of the first mask material layers 14, and the implanted ions easily enter the side walls of the fins 101, thereby affecting the electrical performance of the device. If the included angle between the ion implantation direction and the side walls of the fins 101 is too small, the implanted ions are easily concentrated at the tops of the first mask material layers 14, and the quantity of ions implanted in the side walls of the first mask material layers 14 is very small, which is disadvantageous for the subsequent etching removal of the side walls of the first mask material layers 14. In some implementations, the included angle between the ion implantation direction and the side walls of the fins 101 is 30 to 60 degrees. Specifically, in some implementations, the included angle between the ion implantation direction and the side walls of the fins is 40 degrees to 50 degrees.

In the step that the first mask material layers 14 are etched, the first mask material layers 14 at the tops of the fins and in the isolation regions II may be removed by dry etching or wet etching, thus forming the first mask layers 141.

Next, referring to FIGS. 12 to 13, the isolation layers 13 are etched and thinned by taking the first mask layers 141 as masks.

In some implementations, the isolation layers 13 may be thinned by a wet etching process. Specifically, the material of the isolation layers 13 is silicon oxide. Correspondingly, an etching solution used in the wet etching process is a hydrofluoric acid solution.

In other implementations of the present disclosure, the isolation layers 13 may also be etched and thinned by an HCl steam process.

It should be noted that in some implementations, in addition to the etching and thinning of the isolation layers 13 in the isolation regions II, the isolation layers (as shown in the dotted frames in FIG. 13) between the edge fins 101' and the isolation regions II are also etched and thinned. In terms of the process, the first mask layers 141 may be obtained by only using a doping process, which is simpler and more feasible. In terms of the device performance, the contact area between the gate structure and the side walls of the fins 101' may be enlarged, and the gate control capacity of the device may be improved, thereby further improving the electrical performance of the device.

In some implementations of the present disclosure, after the isolation layers in the isolation regions are thinned, the method further includes that the base with the thinned isolation layers in the isolation regions is annealed. The material stress is released through an annealing process to stabilize the dimension and reduce the deformation and cracking tendency. The isolation layer structure is adjusted in some implementations, so that the thickness of the isolation layers in the isolation regions is reduced, thereby lowering the stress of the isolation layers here, avoiding bending or tilting of the fins due to too much stress of the isolation layers in the isolation regions and improving the electrical performance of the semiconductor structure.

It should be noted that in some implementations of the present disclosure, the thickness of the isolation layers in the isolation regions may also be adjusted according to actual requirements, so that the thinning thickness may be adjusted according to specific requirements.

Figure 14:
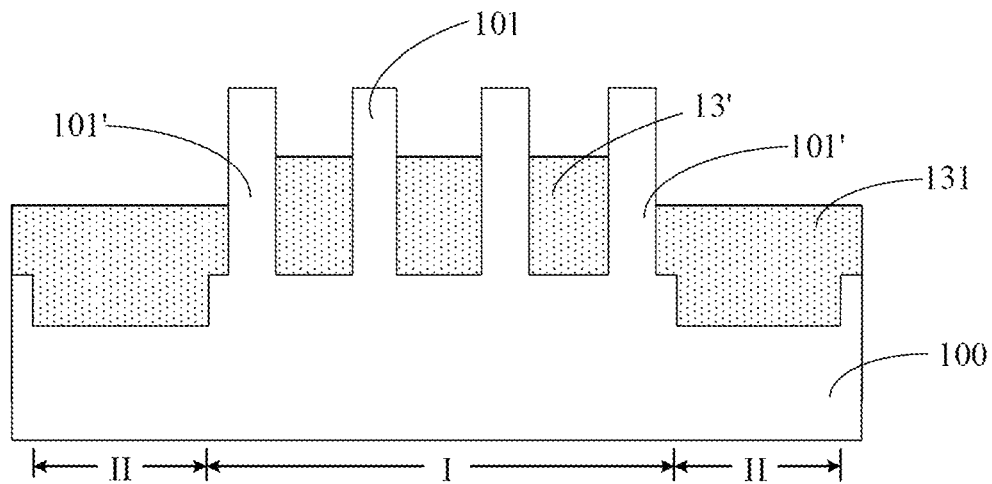

In some implementations, referring to FIG. 14, after the isolation layers 13 are etched and thinned, the method further includes that: the first mask layers are removed. Specifically, the material of the first mask layers is silicon nitride. The first mask layers may be removed by a dry or wet etching process, and the descriptions thereof are omitted herein in the present disclosure.

Continuing to refer to FIG. 14, after the isolation layers are etched and thinned, the formation method further includes that: the fin mask layers and the stress buffer layers are removed.

The tops of the fins are exposed by removing the fin mask layers, so as to provide a process basis for the subsequent formation of a gate structure spanning the fins.

In some implementations, in the step that the fin mask layers are removed, the stress buffer layers (as shown in FIG. 14) between the fin mask layers and the fins are also removed.

Figure 15:
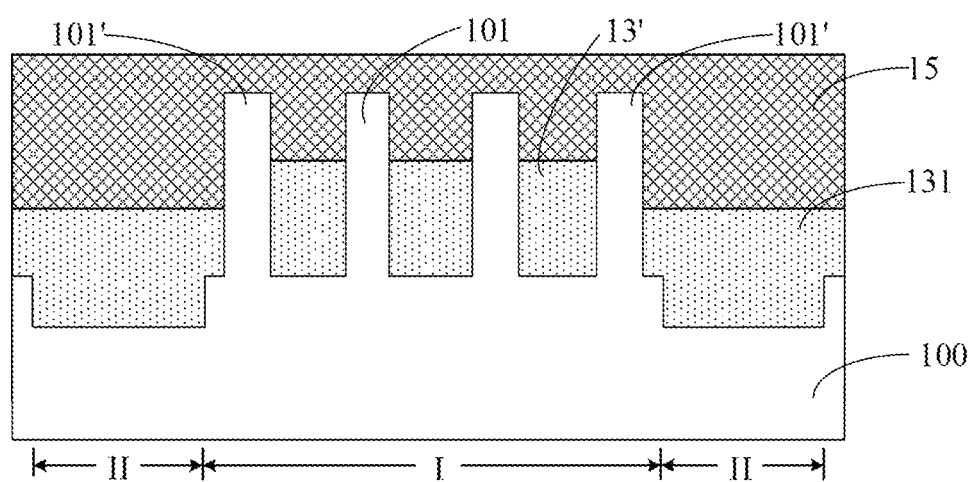

Referring to FIG. 15, after the fin mask layers are removed, the formation method further includes that: a gate structure 15 spanning the fins and covering part of the top surfaces and part of the side walls of the fins is formed.

Specifically, the gate structure 15 may include a gate dielectric material layer and a metal gate (not shown in the figure).

The material of the gate dielectric material layer is a high-k dielectric material. The high-k dielectric material refers to a dielectric material with a relative dielectric constant greater than that of silicon oxide. In some implementations, the material of the gate dielectric material layer is $HfO_2$. In other implementations, the material of the gate dielectric material layer may also be one or more of $ZrO_2$, HfSiO, HfSiON, HfTaO, HfTiO, HfZrO or $Al_2O_3$.

The metal gate serves as an electrode and is configured to realize electrical connection with an external circuit. In some implementations, the material of the metal gate is a magnesium-tungsten alloy. In other implementations, the material of the metal gate structure may also be Al, Cu, Ag, Au, Pt, Ni or Ti and the like.

Since the isolation layers on the sides, facing the isolation region, of the fins, close to the edge of the device region, in the device region of some implementations the regions are etched and thinned, the areas of the side walls of the fins exposed by the isolation layers are larger, and then the contact area between the gate structure and the side walls of the fins is enlarged and the gate control capacity of the device is improved; and therefore, the device has a relatively large Ion/Ioff ratio, and the electrical performance of the device is further improved.

Correspondingly, the implementation of the present disclosure further provides a semiconductor structure. Referring to FIG. 15, a cross-sectional structural schematic diagram of a semiconductor structure of some implementations is shown.

The semiconductor structure includes: a substrate 100, including a device region I for forming a device and isolation regions II located at both sides of the device region; discrete fins 101, protruding from the substrate of the device region I; and isolation layers, located on the substrate 100 exposed by the fins 101, wherein the isolation layers cover part of the side walls of the fins; the isolation layers located in the isolation regions are regarded as target isolation layers 131, and the surfaces of the target isolation layers 131 are lower than the surfaces of the isolation layers 13' between the discrete fins.

In some implementations, the substrate 100 is a silicon substrate. In other implementations, the material of the substrate may also be other materials such as germanium, silicon germanium, silicon carbide, gallium arsenide or gallium indium, and the substrate may also be other types of substrates such as a silicon base or a gallium base on an insulator.

In some implementations, in view of the process, the surface of the substrate formed in the isolation regions is lower than the surface of the substrate formed in the device region, and there is a height difference of 2 nm to 10 nm therebetween.

Since the surface of the substrate of the isolation regions and the surface of the substrate of the device region have the height difference, the isolation layers subsequently formed on the substrate have different thicknesses respectively in the device region and the isolation regions, and thus have different volumes and correspondingly generate different stress, which in turn easily causes a stress imbalance in the device region and the isolation regions and affects the electrical performance of the semiconductor structure.

The fins 101 are configured to subsequently provide a channel of a fin field effect transistor. The material of the fins 101 is the same as the material of the substrate 100. In some implementations, the material of the fins 101 is silicon.

The isolation layers are adopted to play an isolation role between adjacent devices.

In some implementations, the material of the isolation layers is silicon oxide. Silicon oxide is a commonly used low-cost dielectric material, and has relatively high process compatibility, which is advantageous for reduction of the process difficulty and process cost of forming the isolation layers. In addition, the dielectric constant of the silicon oxide is relatively small, which is also advantageous for enhancement of the effect of the isolation layers for isolating adjacent devices. In other implementations, the material of the isolation layers may also be other insulation materials such as silicon nitride and silicon oxynitride.

The surfaces of the target isolation layers 131 are lower than the surfaces of the isolation layers 13' between the discrete fins, so that stress generated by the target isolation layers 131 on the fins 101 may be lowered, which causes the stress on both sides of the fins to be balanced, avoids the problem of bending or tilting of the fins in case of stress imbalance and improves the electrical performance of the semiconductor structure.

In some implementations, the height difference between the surfaces of the target isolation layers and the surfaces of the isolation layers between the discrete fins should neither be too large nor be too small. If the height difference is too large, extremely low stress on one side of the isolation region would be possibly caused, and as a result, the fins bend or tilt toward one side of the isolation region under the stress action of the isolation layers between the fins. If the height difference is too small, it may not play a role in adjusting the stress on both sides of the fins to be balanced.

In some implementations, the height difference is greater than or equal to the height difference between the surface of the substrate of the isolation regions and the surface of the substrate of the device region. Optionally, the height difference is 5 nm to 30 nm. Specifically, the height difference may be 10 nm or 20 nm.

In some implementations, the isolation layers between the isolation regions and edge fins 101' are flush with the target isolation layers, thereby enlarging the exposure area of the side walls of the sides, facing the isolation regions II, of the edge fins 101'. During the subsequent formation of a gate structure spanning part of the side walls of the fins, the contact area between the gate structure and the side walls of the edge fins 101' may be enlarged, so that the gate control capacity of the semiconductor structure is improved, and the electrical performance of the semiconductor structure is further improved.

In some implementations, the semiconductor structure further includes a gate structure 15 spanning the fins 101 and covering part of the top surfaces and part of the side walls of the fins 101.

Specifically, the gate structure 15 may include a gate dielectric material layer and a metal gate (not shown in the figure).

The material of the gate dielectric material layer is a high-k dielectric material. The high-k dielectric material refers to a dielectric material with a relative dielectric constant greater than that of silicon oxide. In some implementations, the material of the gate dielectric material layer is $HfO_2$. In other implementations, the material of the gate dielectric material layer may also be one or more of $ZrO_2$, HfSiO, HfSiON, HfTaO, HfTiO, HfZrO or $Al_2O_3$.

The metal gate serves as an electrode and is configured to realize electrical connection with an external circuit. In some implementations, the material of the metal gate is a magnesium-tungsten alloy. In other implementations, the material of the metal gate structure may also be Al, Cu, Ag, Au, Pt, Ni or Ti and the like.

Since the isolation layers (as shown in the dotted frames in FIG. 13) between the isolation regions and the edge fins in some implementations are flush with the target isolation layers 131, the areas of the side walls of the edge fins exposed by the isolation layers here are larger, and then the contact area between the gate structure 15 and the side walls of the edge fins 101' is larger; and therefore, the gate control capacity of the device is improved, and the electrical performance of the device is further improved.

The semiconductor structure may be formed by the formation method of the foregoing implementation, and may also be formed by other formation methods. Specific descriptions of the semiconductor structure of some implementations may refer to the corresponding descriptions in the some implementations, and descriptions thereof are omitted herein.

It should be noted that the various implementations in the present description are described in a progressive manner. Each implementation focuses on differences from other implementations, and the same and similar parts among the various implementations can refer to each other. For the device type implementations, since it is basically similar to the method implementations, the description is relatively simple, and the relevant parts can refer to part of the descriptions of the method implementation.

Although the present disclosure has been disclosed above, the present disclosure is not limited thereto. Any one skilled in the art can make various changes and modifications without departing from the spirit and scope of the present disclosure. Therefore, the protection scope of the present disclosure shall be based on the scope defined by the appended claims.

What is claimed is:

1. A method for forming a semiconductor structure, comprising:
   providing a base, wherein the base comprises a device region used for forming a device and isolation regions located at both sides of the device region;
   patterning the base to form a substrate and discrete fins and pseudo fins protruding from the substrate, wherein the fins are located in the device region, and the pseudo fins are located in the isolation regions;
   removing the pseudo fins in the isolation regions;
   forming isolation layers on the substrate exposed by the fins, wherein the isolation layers cover part of the side walls of the fins; and
   thinning the isolation layers in the isolation regions, wherein the remaining isolation layers in the isolation regions are regarded as target isolation layers, and surfaces of the target isolation layers are lower than surfaces of the isolation layers between the discrete fins.

2. The method for forming the semiconductor structure according to claim 1, wherein the method further comprises:
   while thinning the isolation layers in the isolation regions, thinning the isolation layers between edge fins and the isolation regions, where the edge fins are fins that are close to an edge of the device region.

3. The method for forming the semiconductor structure according to claim 2, wherein the step of thinning the isolation layers in the isolation regions comprises:
   forming first mask layers, wherein the first mask layers cover only the isolation layers between the discrete fins; and
   etching and thinning the isolation layers using the first mask layers as masks.

4. The method for forming the semiconductor structure according to claim 3, wherein the step of forming the first mask layers comprises:
   forming first mask material layers, wherein the first mask material layers conformally cover the isolation layers and the fins, and completely fill gaps among the discrete fins;
   doping ions on surfaces of the first mask material layers such that an etching rate of the doped first mask material layers is greater than an etching rate of the undoped first mask material layers; and
   etching the first mask material layers to maintain the first mask material layers remaining between the discrete fins as the first mask layers.

5. The method for forming the semiconductor structure according to claim 4, wherein an ion implantation process is adopted to dope the ions on the surfaces of the first mask material layers.

6. The method for forming the semiconductor structure according to claim 5, wherein process parameters for ion implantation comprise:
   the implantation energy is less than or equal to 5 Kev;
   argon ions serve as implanted ions;
   the implantation dose is greater than or equal to 4.0E14 atoms per square centimeter; and
   an implantation direction forms an included angle of 30 to 60 degrees with the side walls of the fins.

7. The method for forming the semiconductor structure according to claim 3, wherein a wet etching process is adopted to etch and thin the isolation layers.

8. The method for forming the semiconductor structure according to claim 1, wherein a height difference between the surfaces of the target isolation layers and the surfaces of the isolation layers between the discrete fins is 5 nm to 30 nm.

9. The method for forming the semiconductor structure according to claim 1, wherein a height difference between a surface of the substrate of the isolation regions and a surface of the substrate of the device region is 2 nm to 10 nm.

10. The method for forming the semiconductor structure according to claim 1, wherein the method further comprises:
   after the step of thinning the isolation layers in the isolation regions, forming a gate structure spanning the fins and covering part of the top surfaces and part of the side walls of the fins.

11. The method for forming the semiconductor structure according to claim 1, wherein the method further comprises:
   after the step of thinning the isolation layers in the isolation regions, annealing the base with the thinned isolation layers in the isolation regions.

* * * * *